(12) United States Patent
Parisi et al.

(10) Patent No.: US 10,917,091 B2
(45) Date of Patent: Feb. 9, 2021

(54) GALVANIC ISOLATION CIRCUIT AND SYSTEM AND A CORRESPONDING METHOD OF OPERATION

(71) Applicant: STMicroelectronics S.r.l., Agrate Brianza (IT)

(72) Inventors: Alessandro Parisi, Mascalucia (IT); Nunzio Greco, Bronte (IT); Nunzio Spina, Catania (IT); Egidio Ragonese, Aci Catena (IT); Giuseppe Palmisano, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 42 days.

(21) Appl. No.: 16/371,919

(22) Filed: Apr. 1, 2019

(65) Prior Publication Data

US 2019/0305775 A1 Oct. 3, 2019

(30) Foreign Application Priority Data

Apr. 3, 2018 (IT) .......................... 102018000004174

(51) Int. Cl.
*H03K 7/08* (2006.01)
*H03K 17/691* (2006.01)
(Continued)

(52) U.S. Cl.
CPC ...... *H03K 17/722* (2013.01); *H02M 3/33523* (2013.01); *H03B 5/06* (2013.01);
(Continued)

(58) Field of Classification Search
CPC ..... H01F 2019/085; H02J 50/05; H02J 50/10; H02M 3/33507; H02M 3/33515;
(Continued)

(56) References Cited

U.S. PATENT DOCUMENTS 4,956,579 A * 9/1990 Albright ................. H01J 65/00
313/608
5,349,523 A 9/1994 Inou et al.
(Continued)

FOREIGN PATENT DOCUMENTS

EP 2814177 A1 12/2014

OTHER PUBLICATIONS

E. Ragonese, N. Spina, A. Castorina, P. Lombardo, N. Greco, A. Parisi, and G.Palmisano, "A fully integrated galvanically isolated DC-DC converter with data communication," IEEE Trans. Circuits Syst. I: Regular Papers, 2017 IEEE (pp. 1-10).
(Continued)

*Primary Examiner* — Levi Gannon
(74) *Attorney, Agent, or Firm* — Crowe & Dunlevy

(57) ABSTRACT

An oscillator is coupled to a first side of a galvanic barrier for supplying thereto an electric supply signal. The oscillator is configured to be alternatively turned on and off as a function of a PWM drive signal applied thereto. A receiver circuit coupled to the galvanic barrier receives therefrom a PWM power control signal. A signal reconstruction circuit coupled between the receiver circuit block and the oscillator provides to the oscillator a PWM drive signal reconstructed from the PWM power control signal. The signal reconstruction circuit includes a PLL circuit coupled to the receiver circuit block and configured to lock to the PWM control signal from the receiver circuit block. A PLL loop within the PLL circuit is sensitive to the PWM drive signal applied to the oscillator. The PLL loop is configured to be opened as a result of the power supply oscillator being turned off.

24 Claims, 2 Drawing Sheets

(51) Int. Cl.
  *H03K 17/723* (2006.01)
  *H03K 17/722* (2006.01)
  *H03B 5/06* (2006.01)
  *H03L 7/08* (2006.01)
  *H03L 7/06* (2006.01)
  *H03L 7/183* (2006.01)
  *H02M 3/335* (2006.01)
  *H02M 1/00* (2006.01)
  *H01F 19/08* (2006.01)

(52) U.S. Cl.
  CPC .............. *H03K 7/08* (2013.01); *H03K 17/691* (2013.01); *H03K 17/723* (2013.01); *H03L 7/06* (2013.01); *H03L 7/08* (2013.01); *H03L 7/183* (2013.01); *H01F 2019/085* (2013.01); *H02M 2001/0012* (2013.01)

(58) Field of Classification Search
  CPC ......... H02M 3/33523; H02M 3/33553; H02M 2001/0012; H03K 7/08; H03K 17/689; H03K 17/691; H03K 17/722; H03K 17/723
  See application file for complete search history.

(56) References Cited

U.S. PATENT DOCUMENTS

| | | | |
|---|---|---|---|
| 6,658,051 B1 | 12/2003 | Liu | |
| 9,685,871 B2* | 6/2017 | Takahashi | H02M 3/33576 |
| 2002/0057584 A1* | 5/2002 | Brockmann | H02J 5/00 |
| | | | 363/98 |
| 2003/0215020 A1 | 11/2003 | Dong et al. | |
| 2004/0037094 A1* | 2/2004 | Muegge | H02M 3/157 |
| | | | 363/21.16 |
| 2004/0239487 A1 | 12/2004 | Hershbarger | |
| 2005/0162874 A1* | 7/2005 | Umetsu | H02M 3/33523 |
| | | | 363/37 |
| 2006/0120115 A1* | 6/2006 | Chen | H02M 3/33569 |
| | | | 363/17 |
| 2007/0014371 A1 | 1/2007 | Fukahori et al. | |
| 2007/0064358 A1* | 3/2007 | Murata | H02M 3/33507 |
| | | | 361/18 |
| 2007/0164720 A1* | 7/2007 | Lalithambika | H02M 3/156 |
| | | | 323/288 |
| 2012/0245649 A1 | 9/2012 | Bohori et al. | |
| 2015/0015156 A1 | 1/2015 | Angelin et al. | |
| 2015/0109831 A1* | 4/2015 | Ohashi | H02M 1/08 |
| | | | 363/21.06 |
| 2015/0180528 A1 | 6/2015 | Ragonese et al. | |
| 2015/0326127 A1 | 11/2015 | Peng et al. | |
| 2017/0070354 A1* | 3/2017 | Ragonese | H04B 3/54 |

OTHER PUBLICATIONS

Lombardo et al: "A Fully-Integrated Half-Duplex Data/Power Transfer System With Up to 40Mbps Data Rate, 23mW Output Power and On-Chip 5kV Galvanic Isolation," IEEE International Solid-State Circuits Conference (ISSCC), San Francisco, USA, Feb. 2016, pp. 300-301.

Z. Tan et al., "A fully isolated delta-sigma ADC for shunt based current sensing," IEEE Journal of Solid-State Circuits, vol. 51, Oct. 2016, pp. 2232-2240.

IT Search Report and Written Opinion for IT Appl. No. 102018000004174 dated Dec. 13, 2018 (8 pages).

* cited by examiner

GALVANIC ISOLATION CIRCUIT AND SYSTEM AND A CORRESPONDING METHOD OF OPERATION

PRIORITY CLAIM

This application claims the priority benefit of Italian Application for Patent No. 102018000004174, filed on Apr. 3, 2018, the content of which is hereby incorporated by reference in its entirety to the maximum extent allowable by law.

TECHNICAL FIELD

The description relates to galvanic isolation techniques.

One or more embodiments may be used in a variety of applications involving communication between two units (for example, interfaces).

Human/data interfaces, bus/network controllers, microcontrollers and associated sensor interfaces, gate drivers for example in medical devices or, more generally, in communication networks are exemplary of possible fields of application of embodiments.

BACKGROUND

Galvanic isolation has been the subject matter of extensive research and innovation activity as witnessed, for example, by various documents discussed in the following by way of introduction to the detailed description of exemplary embodiments.

Despite that extensive activity, further improved solutions are desirable in respect of various aspects such as, for example:
reaching a reasonable tradeoff between cost/area and isolation,
reducing and virtually dispensing with common-mode transient immunity (CMTI) issues, related to the maximum voltage slew rate between two isolated interfaces that a system can withstand,
improving the level of integration,
facilitating a good power efficiency at high galvanic isolation ratings, and
providing high levels of isolation by overcoming certain technology limitations.

There is a need in the art to contribute in pursuing at least part of the goals listed above.

SUMMARY

One or more embodiments relate to a circuit, a system including such a circuit, for example, a pair of units communicating via a galvanic isolation circuit.

One or more embodiments relate to a corresponding method of operation.

One or more embodiments provide for the presence of a galvanic isolation barrier wherein a PWM control signal is reconstructed in an arrangement comprising, for example, a D flip-flop (FFD), a phase-locked loop (PLL) and a pulse generator (PG).

In one or more embodiments:
the PLL may be locked at a sample clock and a switch within the PLL may open the loop during a turn-off time to maintain a correct signal frequency;
a divider may produce therefrom a signal which is synchronized by resetting the divider at the positive edges of the latter signal; and
the flip-flop may be reset at the negative edges of that signal to turn off the power oscillator while the positive edge of the former clock signal can turn on the power oscillator.

One or more embodiments may offer one or more of the following advantages:
appreciable reduction of silicon area and cost insofar as (only) one isolated link is exploited for providing both power transfer and output power control;
the combination of PWM power regulation, a class-D power oscillator and PWM encoding increases both the overall system efficiency and the output power level; and
CMTI can be at least notionally dispensed with insofar as the control loop is not appreciably affected by the possible loss of a bit.

In an embodiment, a circuit comprises: a power supply oscillator coupled to one side of a galvanic barrier to supply thereto an electric supply signal, the power supply oscillator configured to be alternatively turned on and off as a function of a PWM drive signal applied thereto; and a receiver circuit coupled to said one side of the galvanic barrier to receive therefrom a PWM power control signal.

The circuit may (further) comprise: a signal reconstruction network between the receiver circuit and the power supply oscillator, the signal reconstruction network configured to provide to the power supply oscillator a PWM drive signal reconstructed from the PWM power control signal. The signal reconstruction network comprises: a PLL circuit coupled to the receiver circuit and configured to lock to the PWM control signal from the receiver circuit block, wherein the PLL circuit comprises a PLL loop sensitive to the PWM drive signal applied to the power supply oscillator, the PLL loop configured to be opened as a result of the power supply oscillator being turned off.

In an embodiment, a system comprises: a galvanic isolation barrier having a first side and a second side; a power supply unit comprising a circuit as described above, having the power supply oscillator and the receiver circuit block therein coupled to said first side of the galvanic barrier; and a user circuit coupled to the second side of the galvanic barrier and comprising a control generator circuit configured to produce said PWM control signal for transmission to the circuit coupled to the first side of the galvanic barrier over the galvanic barrier.

In an embodiment, a method comprises: supplying an electric supply signal to one side of a galvanic barrier by alternatively turning on and off a power supply oscillator coupled to said one side of the galvanic barrier by applying a PWM drive signal to the power supply oscillator; receiving a PWM power control signal at said one side of the galvanic barrier; providing to the power supply oscillator a PWM drive signal reconstructed from the PWM power control signal via a PLL circuit block locking to the PWM control signal received at said one side of the galvanic barrier, the PLL circuit block comprising a PLL loop sensitive to the PWM drive signal applied to the power supply oscillator; and opening (alternatively, closing) said PLL loop as a result of the power supply oscillator being turned off (alternatively, on).

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
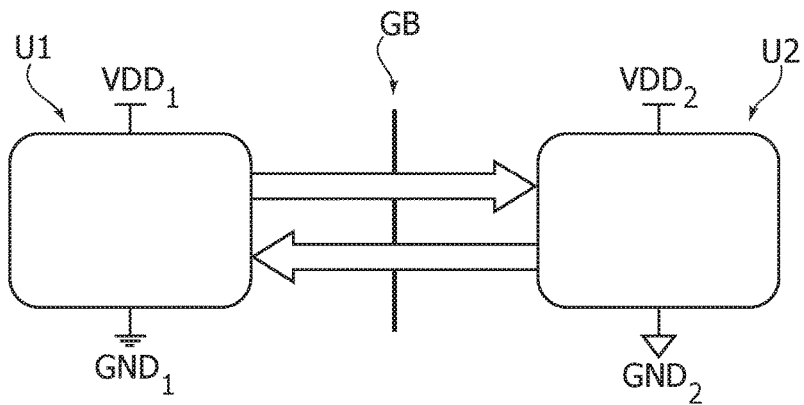
FIG. 1 is a general diagram exemplary of the possible use of a galvanic isolation barrier.

The diagram of FIG. 1 exemplifies two circuit units U1, U2 coupled via a galvanic isolation barrier GB with the possibility of facilitating power transfer (in one direction, for example from unit U1 to unit U2) and data transfer (for example in both directions).

Exemplary of circuit units such as U1 and U2 are circuits such as human/data interfaces, bus/network controllers, microcontrollers (for example, unit U1) and associated sensor interfaces, gate drivers, for example in medical devices and communication networks (for example, unit U2). It will be otherwise appreciated that such list is merely exemplary and non-limiting of the embodiments.

Galvanic barriers as exemplified herein can be used, for example, when one of the units U1, U2 may be exposed to hazardous voltages from which the other unity is intended to be isolated. This may be the case, for example, of certain power devices such as power actuators controlled via a controller interface which is desired to be protected from exposure to high voltages.

A desirable feature of a galvanic barrier GB as exemplified herein is the ability to operate between units U1, U2 supplied with different power supply voltages, for example, $V_{DD1}$, $V_{DD2}$ and/or referred to different grounds, for example, $GND_1$, $GND_2$.

As noted, various approaches have been experimented to facilitate data power transmission with galvanic isolation.

A first approach may involve the use of integrated capacitors which facilitate on-chip galvanic isolation.

This solution, as adopted in various current data/transfer products available on the market, may exhibit certain limitations in terms of trade-off between cost and isolation and the possible use of additional CMI circuitry.

Another approach may involve post-processed transformers. This again represents a solution currently adopted in certain commercial products for data and power transfer, for example in order to facilitate a high CMTI for data transfer along with high galvanic isolation.

Possible disadvantages may be related to a (low) level of integration and/or to power efficiency exposed to degradation at high galvanic isolation ratings.

Still another approach (adopted, for example, in various products available from STMicroelectronics) involves on-chip galvanic isolation. This may be used in data transfer products in order to facilitate achieving high CMI values for data transfer.

This approach facilitates achieving power transfer using BCD (Binary-CMOS-DMOS)/SOI (Silicon On Insulator) technology in conjunction with satisfactory isolation ratings compatible with oxide thickness (for example, 6 kV max).

Such an approach is exemplified, for example, in the following documents (incorporated by reference):

N. Spina, et al.: "Current-reuse transformer coupled oscillators with output power combining for galvanically isolated power transfer systems", IEEE T-CAS I, vol. 62, pp. 2940-2948, December 2016, and P. Lombardo, et al.: "A fully-integrated half-duplex/data power transfer system with up to 40 Mbps data rate, 23 mW output power and on-chip 5 kV galvanic isolation", IEEE ISSCC, 300-301, February 2016.

Another discriminating factor in galvanic barriers where transfer of power, control signals and data is considered lies in the number of isolated links (lines). Notionally, transfer of power, control and data may involve four links: one for power, one for control and two for data transfer (if bidirectional transfer is contemplated).

An arrangement as discussed, for example, in the reference Z. Tan, et al.: "A fully isolated delta-sigma ADC for shunt based current sensing", IEEE Journal of Solid-State Circuits, vol. 51, October 2016, pp. 2232-2240 (incorporated by reference), facilitates reducing the number of links to three by conveying control and data (one direction) over a single link.

An arrangement as discussed in P. Lombardo, et al. (already cited) may use a single link for power plus bidirectional data communication.

An arrangement as discussed in United States Patent Application Publication No. 2017/0358993 (incorporated by reference) as well as in the reference E. Ragonese, et al.: "A fully integrated galvanically isolated DC-DC converter with data communication", IEEE Trans. Circuits Syst. Volume: PP, Issue 99, pp. 1-10 (incorporated by reference) may use a link for power plus a link for control and bidirectional data communication.

Still another arrangement as exemplified, for example in U.S. patent application Ser. No. 16/244,272 (corresponding to Italian Patent Application No. 102018000000830) incorporated by reference, uses a single link to facilitate transfer of power and control signals plus uni-directional communication.

One or more embodiments may adopt the structure exemplified in FIG. 2 again comprising two circuit units U1, U2 (for example of the type exemplified in the foregoing) exchanging electrical signals (power, control and data) through a galvanic isolation barrier GB.

Figure 2:
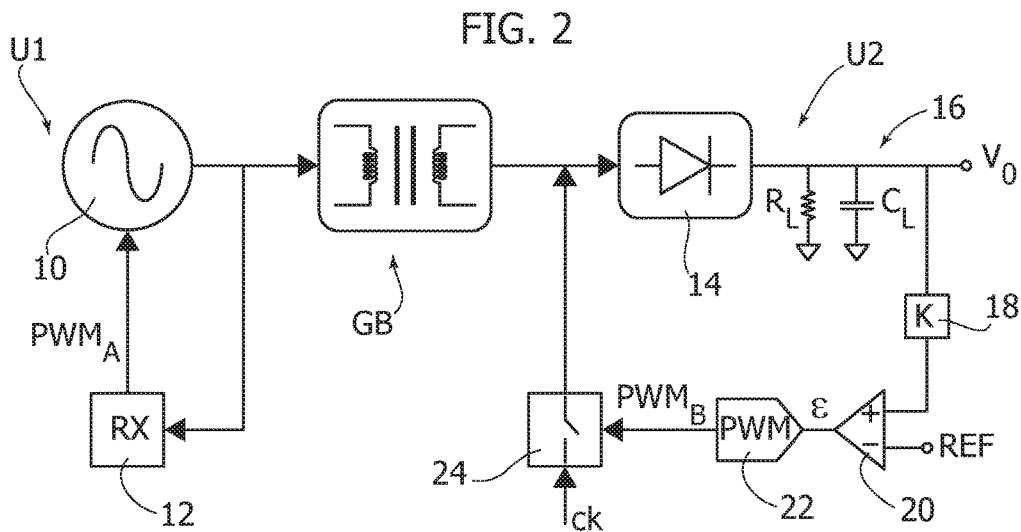
FIG. 2 is a block diagram exemplary of a possible context of use of embodiments.

The barrier GB may be implemented in any way known for that purpose. A transformer is schematically shown in FIG. 2 as an example of such a barrier.

In one or more embodiments, the output power control can be implemented on a (single) isolated power link, thus reducing the number of isolated links.

In one or more embodiments, a PWM (Pulse-Width-Modulation) control strategy can be used to facilitate (highly) efficient power control.

In one or more embodiments, the PWM control signal can be sampled and transmitted by modulating (for example via ASK—Amplitude Shift Keying modulation) the power signal.

In the diagram of FIG. 2, the circuit unit U1 is exemplified as comprising a power oscillator 10 to which a PWM modulating signal $PWM_A$ can be applied for example, by alternatively switching the power oscillator 10 on and off as a function of a signal received from a (receiver) circuit 12.

As discussed in the following, the receiver circuit 12 may be configured to reconstruct for that purpose a PWM control signal $PWM_B$ as generated on the opposed side of the the galvanic isolation barrier GB, that is at unit U2.

There, the signal from the power oscillator 10 as transmitted through the galvanic isolation barrier GB is applied to a rectifier circuit 14 to generate an output signal $V_o$.

The output signal $V_o$ from the rectifier circuit 14 (to which low-pass filtering can be applied by the resistor-capacitor (RC) filter circuit 16 can be used for supplying various "user" units (not visible in FIG. 2).

The arrangement and operation of the rectifier circuit 14 and the low-pass filter circuit 16 is otherwise conventional in the art.

A signal indicative of the value of the (for example, voltage) output signal $V_O$ can be supplied, for example, via an optional level-shifter circuit 18 (scale factor equal to K) to one of the inputs (for example, the inverting input) of an error amplifier 20 whose other input is coupled to a reference node receiving a reference signal REF.

The comparator is thus in a position to drive, via an error signal ε, a PWM modulator 22 which generates the PWM signal $PWM_B$ already discussed in the foregoing. This is in turn applied to switch 24 (for example, a modulator) clocked with a clock frequency ck to generate a modulated signal suited to be transmitted towards the unit U1 through the galvanic isolation barrier GB.

Other than for the points discussed in the following, the various circuits exemplified in FIG. 2 can be regarded as individually known in the art, thus making it unnecessary to provide a more detailed description herein.

Also, it will be appreciated that the diagram of FIG. 2 refers for simplicity to the transmission of power and power control through the galvanic barrier GB (for example, power from U1 to U2 and power control from U2 to U1).

Transmission (for example, bidirectional) of data through the barrier GB may take place by known means (not visible in FIG. 2 for simplicity), for example by resorting to various solutions as discussed in the documents cited previously and incorporated by reference.

An issue addressed by one or more embodiments is that, in a context of use as exemplified in FIG. 1, during "off" times of the power oscillator 10, no data transmission may occur through the galvanic isolation barrier GB with an ensuing difficulty in establishing how the power oscillator 10 may be (again) turned on.

Figure 3:
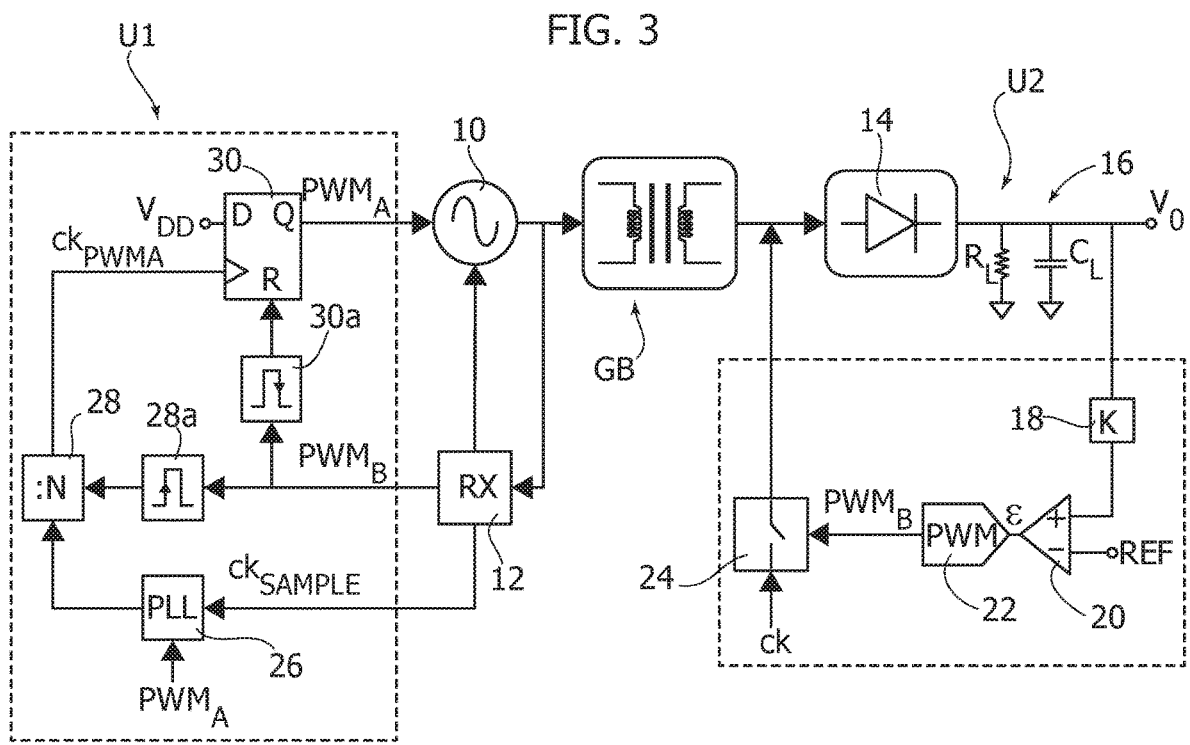
FIGS. 3 and 4 are block diagrams exemplary of various implementation options of embodiments, FIG. 5 comprises four portions, designated a), b), c) and d), respectively, indicative of possible time behaviors of signals in embodiments.

The diagram of FIG. 3 is exemplary of one or more embodiments wherein the signal $PWM_A$ driving the power oscillator 10 can be "reconstructed" starting from the $PWM_B$ signal as received at the receiver 12 (in the unit U1).

In FIG. 3 parts or elements like parts or elements already discussed in connection with the previous figures are indicated with like references/numerals. A corresponding detailed description will not be repeated here for brevity.

In one or more embodiments as exemplified in FIG. 3, in addition to providing the signal $PWM_B$, the receiver 12 also provides a (sample) clock signal $ck_{SAMPLE}$ derived therefrom. For instance, the sample clock signal $ck_{SAMPLE}$ can be derived from the positive/negative edges, optionally from the positive (rising) edges of $PWM_B$.

The sample clock signal $ck_{SAMPLE}$ is supplied to a PLL circuit 26 (see FIG. 4, to be discussed later) with the output signal from the PLL 26 fed to a (clock frequency) divider 28 with a division factor N. The divider 28 is configured to produce a signal (designated $ck_{PWMA}$) at the same frequency of $PWM_B$.

In one or more embodiments, synchronization of $ck_{PWMA}$ and $PWM_B$ (that is, facilitating $ck_{PWMA}$ and $PWM_B$ having time aligned wavefronts) may involve resetting the divider 28 at a divider reset input 28a (for ease of explanation, this is exemplified as a separate block in FIG. 3 but may in fact be integrated in the divider 28) at each (for example, positive) edge of $PWM_B$.

Reference 30 denotes a flip-flop (for example, a D flip-flop or FFD) supplied with a supply voltage $V_{DD}$ at its D input.

The flip-flop 30 receives as an input clock the signal $ck_{PWMA}$ from the divider 28 and is reset at a reset input 30a (again, for ease of explanation, this is exemplified as a separate block in FIG. 3 but may in fact be integrated in the flip-flop 30) at the "other" edges (for example the negative edges) of $PWM_B$.

These negative edges of $PWM_B$ may thus facilitate resetting the flip-flop 30 to turn off the power oscillator 10 while the positive edges as conveyed by $ck_{PWMA}$ may turn on the power oscillator 10.

It will be otherwise appreciated that referring to the negative and positive edges turning the oscillator 10 on and off, respectively, is merely exemplary of certain possible embodiments. Those of skill in the art will appreciate that one or more embodiments may in fact facilitate the same kind of operation by resorting, for example, to complementary logical relationships.

Figure 4:
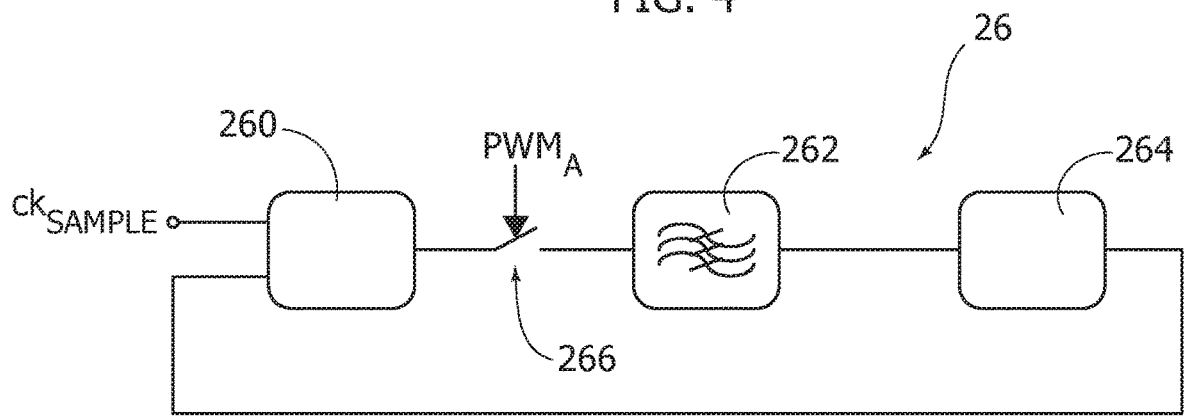

FIG. 4 simplifies a possible embodiment of the PLL circuit 26 comprising an input stage (phase comparator circuit) 260, a loop filter circuit 262 cascaded thereto as well as a ring oscillator circuit 264 (for example a voltage-controlled oscillator—VCO) whose output signal is fed back to the input stage 260 for comparison with the signal $ck_{SAMPLE}$ fed to the PLL via the receiver circuit 12.

In one or more embodiments, a switch 266 (for example, an electronic switch such as a MOSFET transistor) may be provided in the loop of the PLL circuit 26 (for example between the input stage 260 and the loop filter 262) to open the loop during the turn off times of the power oscillator 10 thus facilitating maintaining an adequate signal frequency.

In one or more embodiments as exemplified herein, this operation can be facilitated by actuating the switch 266 via the signal $PWM_A$ which turns on and off the power oscillator 10.

It will be again appreciated that in one or more embodiments, the same kind of operation (switch 266 closed, that is conductive, with the PLL tracking the signal $ck_{SAMPLE}$, during turn on phases of the oscillator 10—switch 266 open, that is non-conductive, with the PLL maintaining the signal frequency, during turn off phases of the oscillator 10) can be facilitated by resorting, for example, to complementary logical relationships.

The elements 26 (PLL), 28 (divider for example, by a factor N) and 30 (flip-flop) thus provide a circuit which reconstructs the PWM control signal as received from the galvanic isolation barrier GB even during the power oscillator "off" times.

Figure 5:
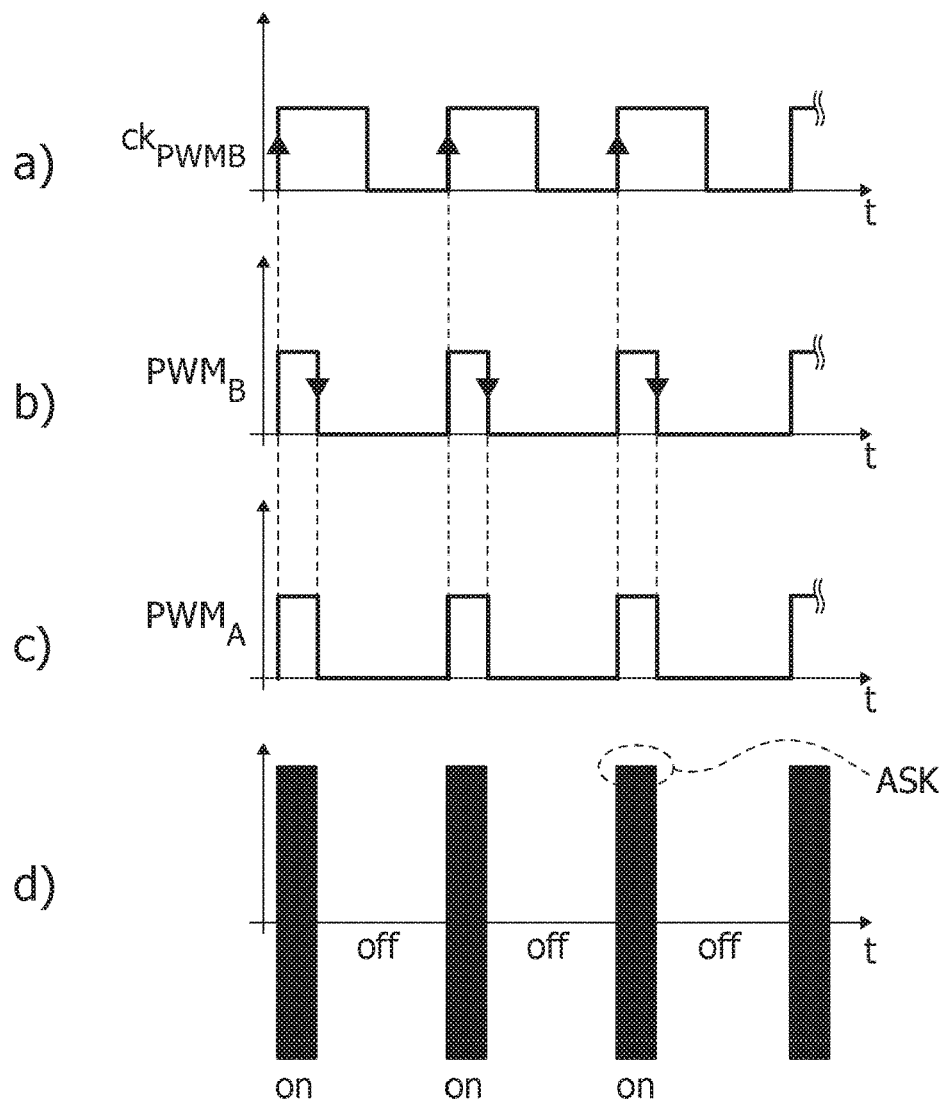

The diagrams of FIG. 5 are exemplary of the possibility of transmitting the PWM control signal (for example, PWM$_B$ as transmitted from U2 to U1, that is from right to left in FIG. 3) by using ASK modulation of the power signal. Modulation may be performed with a (low) modulation index (for example 5%) thus facilitating achieving a high efficiency.

The diagrams in portions a) to d) in FIG. 5 are exemplary of possible time behaviors of the following signals:
- ck$_{PWMB}$ is the clock signal associated with PWM$_B$, that is the clock from which PWM$_B$ is derived (ck$_{PWMB}$ and PWM$_B$ thus have the same frequency)—portion a);
- PWM$_B$—portion b);
- PWM$_A$ (reconstructed)—portion c,
- oscillation of the power oscillator 10 onto which an ASK modulation can be superposed to convey the PWM$_B$ power control signal—portion d).

It will be appreciated that this latter representation is merely exemplary of possible operation of a barrier GB comprising, for example, a transformer in conveying both a power signal from unit U1 to unit U2 and a power control signal (for example, PWM$_B$—ASK-modulated onto the power signal) from unit U2 to unit U1.

The circuit blocks designated 18, 20, 22, 24 in FIGS. 2 and 3 (as described previously) in fact comprise a control circuit block adapted to generate and transmit the power control signal from Unit 2 (back) to unit U1.

One or more embodiments may thus reduce the silicon area and system costs by exploiting (only) one isolated link to provide both power transfer and output power control.

As noted, this may occur in combination with (possibly bi-directional) data transmission facilitated by known means.

One or more embodiments may adopt a PWM power regulation together with a class D power oscillator and PWM encoding, which facilitates increasing both efficiency of the overall system and the output power level.

In one or more embodiments CMTI issues may be essentially dispensed with since, as already noted, the possible loss of a bit does not appreciable effect control loop operation.

A circuit according to one or more embodiments may comprise:
- a power supply oscillator (for example, 10) couplable to one side of a galvanic barrier (for example, GB) to supply thereto an electric supply signal, the power supply oscillator configured to be alternatively turned on and off as a function of a PWM drive signal (for example, PWM$_A$) applied thereto, and
- a receiver circuit block (for example, 12) configured to be coupled to said one side of the galvanic barrier to receive therefrom a PWM power control signal (for example, PWM$_B$).

As noted, in one or more embodiments, the power supply oscillator may comprise a Class D oscillator with a PWM control, which facilitates achieving an increased efficiency.

As exemplified herein, the signal PWM$_B$ is generated in the unit U2 and "reconstructed" in the unit U1.

As discussed previously, the receiver 12 may receive the signal PWM$_B$ from the galvanic barrier GB as an (for example, ASK) modulated signal over a carrier as provided by the power oscillator 10 (see the portion d) of FIG. 5).

That is, the signal PWM$_B$ as generated in the unit U2 contains the power control information. Such information may then be reconstructed in the unit U1 in order to drive the power supply oscillator 10 (for example, via PWM$_A$).

For instance, in the unit U2 the signal PWM$_B$ can be encoded as binary data (with PWM encoding; for example "0">>>duty cycle=30%, "1">>>duty cycle=70%).

In order to be transmitted through the galvanic barrier GB, these data can be used to modulate (for example, ASK) the carrier provided by power supply oscillator 10. The receiver 12 de-modulates (for example, via ASK demodulation) the signal from the barrier GB and extracts therefrom the encoded bits which are representative of the signal PWM$_B$.

A circuit according to one or more embodiments may (further) comprise:
- a signal reconstruction network (for example, 26, 28, 30) between the receiver circuit block and the power supply oscillator, the signal reconstruction network configured to provide to the power supply oscillator a PWM drive signal reconstructed from the PWM power control signal,
- wherein the signal reconstruction network comprises a PLL circuit block (for example, 26) coupled to the receiver circuit block and configured to lock to the PWM control signal (for example, to the sample clock signal ck$_{SAMPLE}$ associated with PWM$_B$) from the receiver circuit block, the PLL circuit block comprising a PLL loop (for example, 260, 262, 264, 266) sensitive to the PWM drive signal applied to the power supply oscillator, the PLL loop configured to be opened as a result of the power supply oscillator being turned off.

In one or more embodiments, the PLL loop may comprise a switch (for example, 266) switchable, under the control of the PWM drive signal applied to the power supply oscillator, between a first, conductive state wherein the PLL loop is active (closed) and a second, non-conductive state wherein the PLL loop is inactive (open).

With the loop open, the PLL may facilitate maintaining a clock to turn on (again) the oscillator 10. For instance, with the PLL loop open, discharge of the capacitance in the filter 262 is countered so that the lock voltage at the time preceding opening the loop is memorized.

In one or more embodiments, the PLL loop switch may be switchable between:
- a first, conductive state wherein the PLL loop is active, with the PWM drive signal at a first value (for example "1") providing activation of the power supply oscillator, and
- a second, non-conductive state wherein the PLL loop is inactive, with the PWM drive signal at a second value (for example "0") providing de-activation of the power supply oscillator.

In one or more embodiments, the PLL circuit block may comprise an input comparison stage (for example, 260) followed by a loop filter (for example, 262) wherein the switch (for example, 266) may be arranged between the comparison stage and the loop filter.

In one or more embodiments, the PLL circuit block may be configured to lock on a sample clock signal (for example ck$_{SAMPLE}$) of the PWM control signal (for example, PWM$_B$) from the receiver circuit block.

In one or more embodiments, the signal reconstruction network may comprise a divider (for example, 28) intermediate the PLL circuit block and the power supply oscillator, the divider configured to provide a clocking signal (for example, ck$_{PWMA}$) for said PWM drive signal (for example, PWM$_A$) for the power supply oscillator.

In one or more embodiments, the signal reconstruction network may comprise a bi-stable circuit element (for example, 30), optionally an (for example) D flip-flop, clocked by said clocking signal, the bi-stable circuit element having an output node (for example, Q) coupled to the power supply oscillator and providing thereto said PWM drive signal.

In one or more embodiments, the receiver circuit block may be coupled with said divider and said bi-stable circuit element, wherein the divider and the bi-stable circuit element are configured to be reset by opposed edges (for example, positive and negative edges) of the PWM control signal from the receivers circuit block.

In one or more embodiments, the divider and the bi-stable circuit element may be configured to be reset by the positive edges and the negative edges, respectively, of the PWM control signal.

In one or more embodiments, a system may comprise:
- a galvanic isolation barrier (for example GB) having a first side and a second side (for example left and right in FIGS. 2 and 3,
- a power supply unit (for example, U1) comprising a circuit according to one or more embodiments, having the power supply oscillator and the receiver circuit block therein coupled to said first side of the galvanic barrier, and
- a user unit (for example, U2) coupled to the second side of the galvanic barrier and comprising a control generator circuit (for example, 18, 20, 22, 24) configured to produce said PWM control signal (for example, $PWM_B$) for transmission to the circuit coupled to the first side of the galvanic barrier over the galvanic barrier.

In one or more embodiments, the user unit may comprise a rectifier circuit (for example, 14, 16) coupled to the second side of the galvanic barrier and configured to receive an electrical supply signal from the power supply oscillator in the power supply unit via the galvanic barrier.

In one or more embodiments, a method may comprise:
- supplying an electric supply signal to one side of a galvanic barrier by alternatively turning on and off a power supply oscillator coupled to said one side of the galvanic barrier by applying a PWM drive signal to the power supply oscillator,
- receiving a PWM power control signal at said one side of the galvanic barrier,
- providing to the power supply oscillator a PWM drive signal reconstructed from the PWM power control signal via a PLL circuit block locking to the PWM control signal (for example to $ck_{SAMPLE}$, a sample clock derived, for example from the rise or positive edges of $PWM_B$) received at said one side of the galvanic barrier (GB) (for example as received and de-modulated at the unit U1), the PLL circuit block comprising a PLL loop sensitive to the PWM drive signal applied to the power supply oscillator,
- opening (alternatively, closing) said PLL loop as a result of the power supply oscillator being turned off (alternatively, on).

Without prejudice to the underlying principles, the details and the embodiments may vary, even significantly, with respect to what has been described by way of example only, without departing from the extent of protection.

The extent of protection is determined by the annexed claims.

The invention claimed is:

1. A circuit, comprising:
a power supply oscillator configured to be coupled to one side of a galvanic barrier in order to supply thereto an electric supply signal, wherein the power supply oscillator is alternatively turned on and off as a function of a PWM drive signal applied thereto;
a receiver circuit configured to be coupled to said one side of the galvanic barrier and to receive therefrom a PWM power control signal; and
a signal reconstruction circuit between the receiver circuit and the power supply oscillator, the signal reconstruction circuit configured to provide to the power supply oscillator said PWM drive signal reconstructed from the PWM power control signal;
wherein the signal reconstruction circuit comprises a PLL circuit coupled to the receiver circuit and configured to lock to the PWM control signal, the PLL circuit comprising a PLL loop that is sensitive to the PWM drive signal applied to the power supply oscillator, the PLL loop configured to be opened in response to the power supply oscillator being turned off.

2. The circuit of claim 1, wherein the PLL loop comprises a switch that is switchable, in response to the PWM drive signal, between a first, conductive state wherein the PLL loop is active and a second, non-conductive state wherein the PLL loop is inactive.

3. The circuit of claim 2, wherein the PLL circuit comprises an input comparison stage followed by a loop filter wherein the switch is arranged between the input comparison stage and the loop filter.

4. The circuit of claim 1, wherein the PLL loop comprises a switch that is switchable, in response to the PWM drive signal, between:
a first, conductive state wherein the PLL loop is active, with the PWM drive signal at a first value providing activation of the power supply oscillator, and
a second, non-conductive state wherein the PLL loop is inactive, with the PWM drive signal at a second value providing de-activation of the power supply oscillator.

5. The circuit of claim 4, wherein the PLL circuit comprises an input comparison stage followed by a loop filter wherein the switch is arranged between the input comparison stage and the loop filter.

6. The circuit of claim 1, wherein the PLL circuit is configured to lock on a sample clock signal of the PWM control signal output from the receiver circuit.

7. The circuit of claim 1, wherein the signal reconstruction circuit comprises: a divider circuit that is connected intermediate the PLL circuit and the power supply oscillator, the divider circuit configured to provide a clocking signal for said PWM drive signal for the power supply oscillator.

8. The circuit of claim 7, wherein the signal reconstruction circuit comprises a bi-stable circuit element that is clocked by said clocking signal and has an output node for providing said PWM drive signal to the power supply oscillator.

9. The circuit of claim 8, wherein the bi-stable circuit element is a D flip-flop.

10. The circuit of claim 8, wherein the receiver circuit is coupled with said divider circuit and said bi-stable circuit element, wherein the divider circuit and the bi-stable circuit element are configured to be reset by opposed edges of the PWM control signal output from the receiver circuit.

11. The circuit of claim 10, wherein the divider circuit and the bi-stable circuit element are configured to be reset by the positive edges and the negative edges, respectively, of the PWM control signal.

12. A system, comprising:
a galvanic isolation barrier having a first side and a second side,
a power supply unit comprising a circuit comprising:
- a power supply oscillator coupled to the first side of the galvanic barrier in order to supply thereto an electric supply signal, wherein the power supply oscillator is alternatively turned on and off as a function of a PWM drive signal applied thereto;
- a receiver circuit coupled to said first side of the galvanic barrier in order to receive therefrom a PWM power control signal;
- a signal reconstruction circuit between the receiver circuit and the power supply oscillator, the signal reconstruction circuit configured to provide to the power supply oscillator said PWM drive signal reconstructed from the PWM power control signal;
- wherein the signal reconstruction circuit comprises a PLL circuit coupled to the receiver circuit and configured to lock to the PWM control signal, the PLL circuit comprising a PLL loop that is sensitive to the PWM drive signal applied to the power supply oscillator, the PLL loop configured to be opened in response to the power supply oscillator being turned off; and
a user circuit coupled to the second side of the galvanic barrier and comprising a control generator circuit configured to produce said PWM control signal for transmission to the circuit coupled to the first side of the galvanic barrier over the galvanic barrier.

13. The circuit of claim 12, wherein the PLL loop comprises a switch that is switchable, in response to the PWM drive signal, between a first, conductive state wherein the PLL loop is active and a second, non-conductive state wherein the PLL loop is inactive.

14. The circuit of claim 13, wherein the PLL circuit comprises an input comparison stage followed by a loop filter wherein the switch is arranged between the input comparison stage and the loop filter.

15. The circuit of claim 13 wherein the PLL loop comprises a switch that is switchable, in response to the PWM drive signal, between:
- a first, conductive state wherein the PLL loop is active, with the PWM drive signal at a first value providing activation of the power supply oscillator, and
- a second, non-conductive state wherein the PLL loop is inactive, with the PWM drive signal at a second value providing de-activation of the power supply oscillator.

16. The circuit of claim 15, wherein the PLL circuit comprises an input comparison stage followed by a loop filter wherein the switch is arranged between the input comparison stage and the loop filter.

17. The circuit of claim 13, wherein the signal reconstruction circuit comprises: a divider circuit that is connected intermediate the PLL circuit and the power supply oscillator, the divider circuit configured to provide a clocking signal for said PWM drive signal for the power supply oscillator.

18. The circuit of claim 17, wherein the signal reconstruction circuit comprises a bi-stable circuit element that is clocked by said clocking signal and has an output node for providing said PWM drive signal to the power supply oscillator.

19. The circuit of claim 18, wherein the receiver circuit is coupled with said divider circuit and said bi-stable circuit element, wherein the divider circuit and the bi-stable circuit element are configured to be reset by opposed edges of the PWM control signal output from the receiver circuit.

20. The circuit of claim 19, wherein the divider circuit and the bi-stable circuit element are configured to be reset by the positive edges and the negative edges, respectively, of the PWM control signal.

21. The system of claim 12, wherein the user circuit comprises a rectifier circuit coupled to the second side of the galvanic barrier and configured to receive an electrical supply signal from the power supply oscillator in the power supply unit via the galvanic barrier.

22. A method, comprising:
supplying an electric supply signal to a first side of a galvanic barrier by alternatively turning on and off a power supply oscillator coupled to said one side of the galvanic barrier by applying a PWM drive signal to the power supply oscillator;
receiving a PWM power control signal at said first side of the galvanic barrier;
providing to the power supply oscillator said PWM drive signal reconstructed from the PWM power control signal via a PLL circuit that operates to lock to the PWM control signal received at said one side of the galvanic barrier, the PLL circuit comprising a PLL loop sensitive to the PWM drive signal applied to the power supply oscillator; and
controlling opening and closing said PLL loop as a result of the power supply oscillator being turned off and on, respectively.

23. The circuit of claim 12, wherein the PLL circuit is configured to lock on a sample clock signal of the PWM control signal output from the receiver circuit.

24. The circuit of claim 18, wherein the bi-stable circuit element is a D flip-flop.

* * * * *